(12) United States Patent
Zhang

(10) Patent No.: US 7,821,132 B2
(45) Date of Patent: Oct. 26, 2010

(54) CONTACT PAD AND METHOD OF FORMING A CONTACT PAD FOR AN INTEGRATED CIRCUIT

(75) Inventor: Leilei Zhang, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 349 days.

(21) Appl. No.: 11/810,616

(22) Filed: Jun. 5, 2007

(65) Prior Publication Data

US 2008/0303152 A1    Dec. 11, 2008

(51) Int. Cl.
*H01L 23/48* (2006.01)
*H01L 23/52* (2006.01)

(52) U.S. Cl. .................. 257/737; 257/773; 257/786; 257/E23.021

(58) Field of Classification Search ................ 257/737, 257/773, 786, E23.021
See application file for complete search history.

(56) References Cited

U.S. PATENT DOCUMENTS

| | | | | |
|---|---|---|---|---|
| 5,592,736 | A * | 1/1997 | Akram et al. | 29/841 |
| 5,686,762 | A * | 11/1997 | Langley | 257/775 |
| 6,291,897 | B1 * | 9/2001 | Wark et al. | 257/786 |
| 6,313,541 | B1 * | 11/2001 | Chan et al. | 257/786 |
| 6,384,343 | B1 | 5/2002 | Furusawa | |
| 7,170,187 | B2 * | 1/2007 | Bernier et al. | 257/784 |
| 7,394,159 | B2 * | 7/2008 | Goto et al. | 257/773 |
| 2003/0216023 | A1 | 11/2003 | Wark et al. | |
| 2006/0192285 | A1 * | 8/2006 | Kilger et al. | 257/737 |

* cited by examiner

*Primary Examiner*—Nitin Parekh
(74) *Attorney, Agent, or Firm*—John J. King

(57) ABSTRACT

A contact pad in an integrated circuit is disclosed. The contact pad comprises a flat portion comprising a base of the contact pad; a plurality of projections extending from and substantially perpendicular to the flat portion; and a solder ball attached to the projections and the flat portion. A method of forming a contact pad is also disclosed.

17 Claims, 4 Drawing Sheets

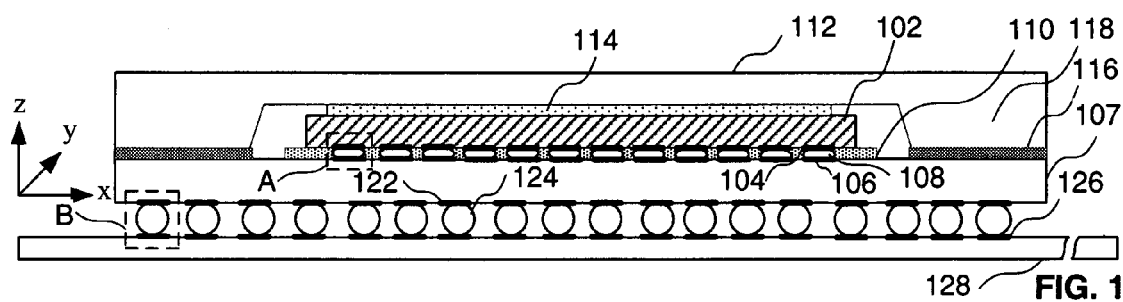
FIG. 1
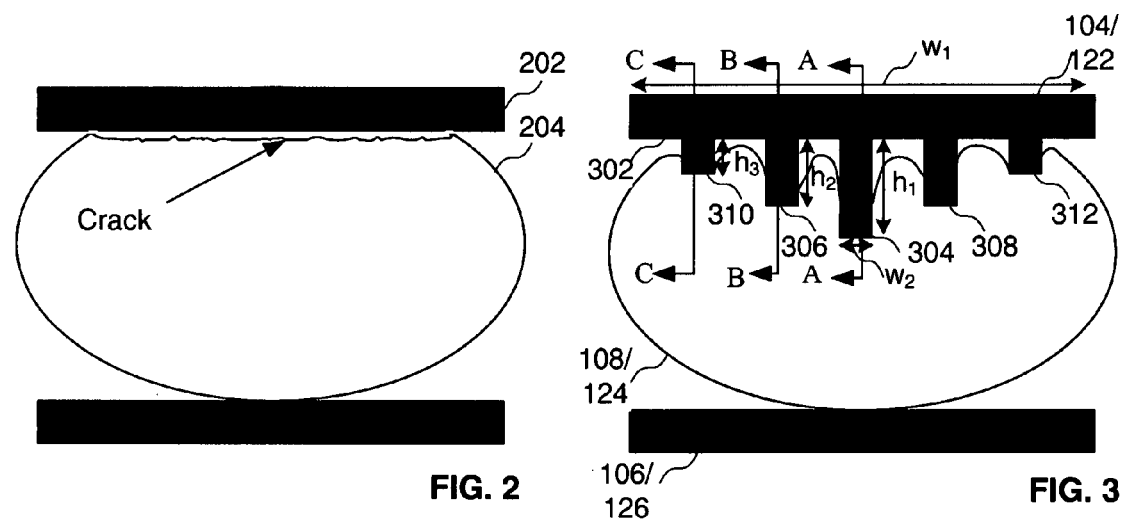
FIG. 2
FIG. 3
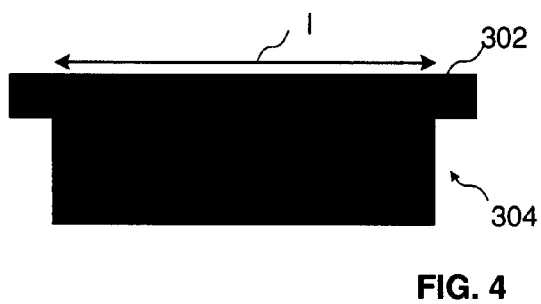
FIG. 4
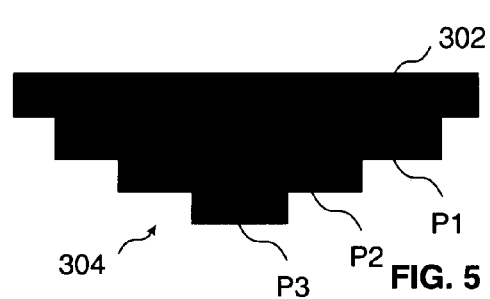
FIG. 5
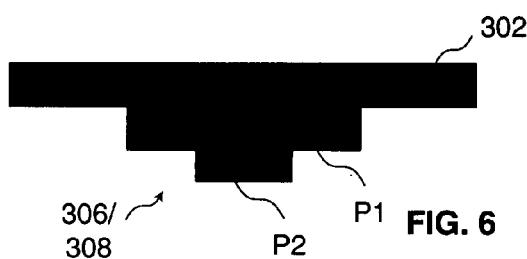
FIG. 6
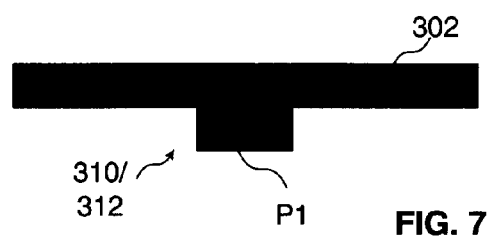
FIG. 7

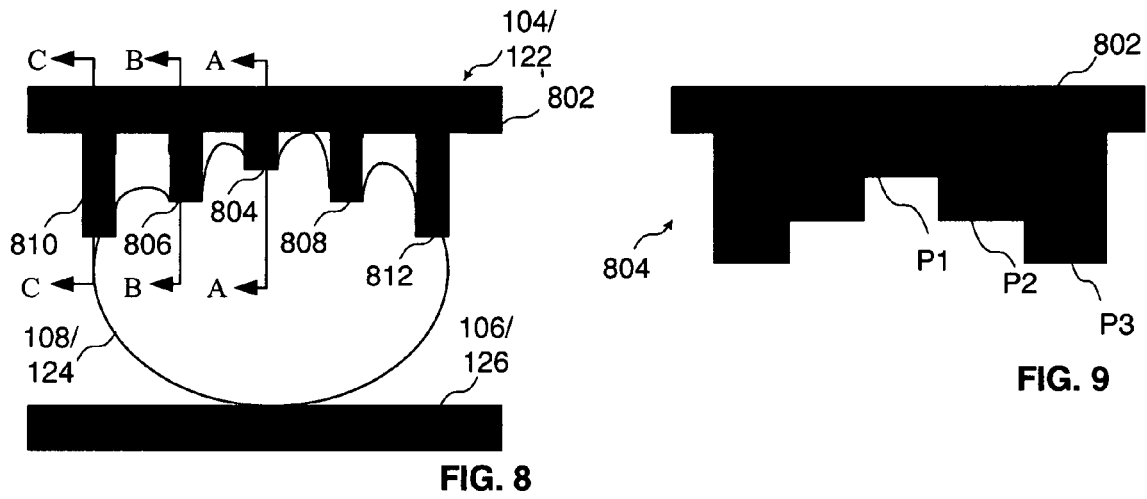
FIG. 8
FIG. 9
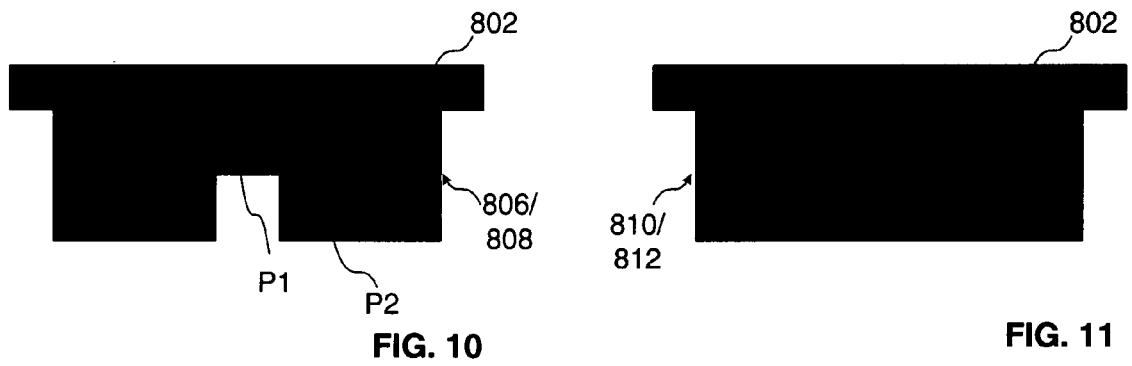
FIG. 10
FIG. 11
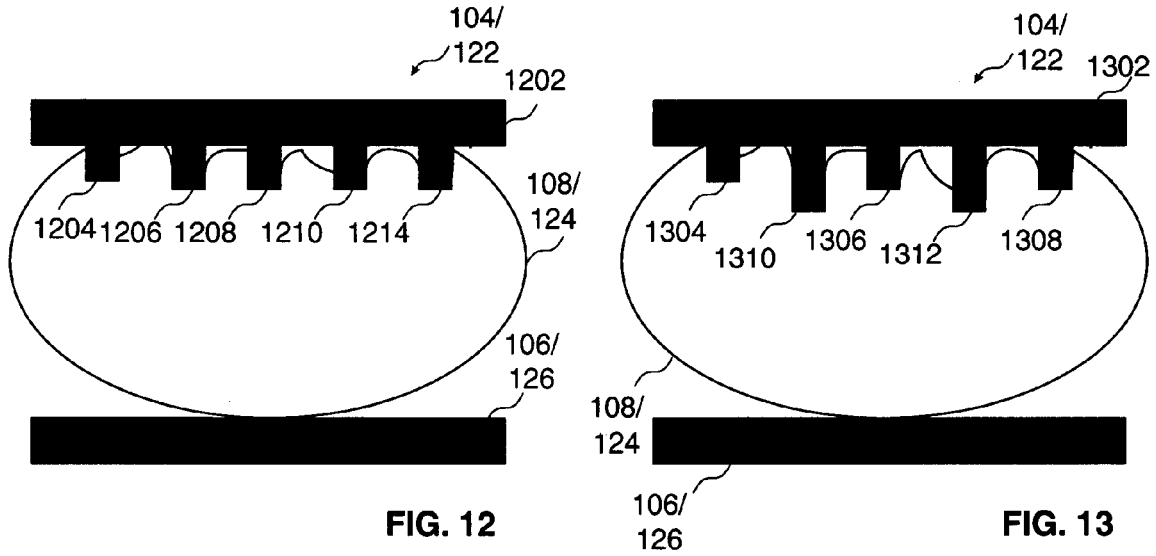
FIG. 12
FIG. 13

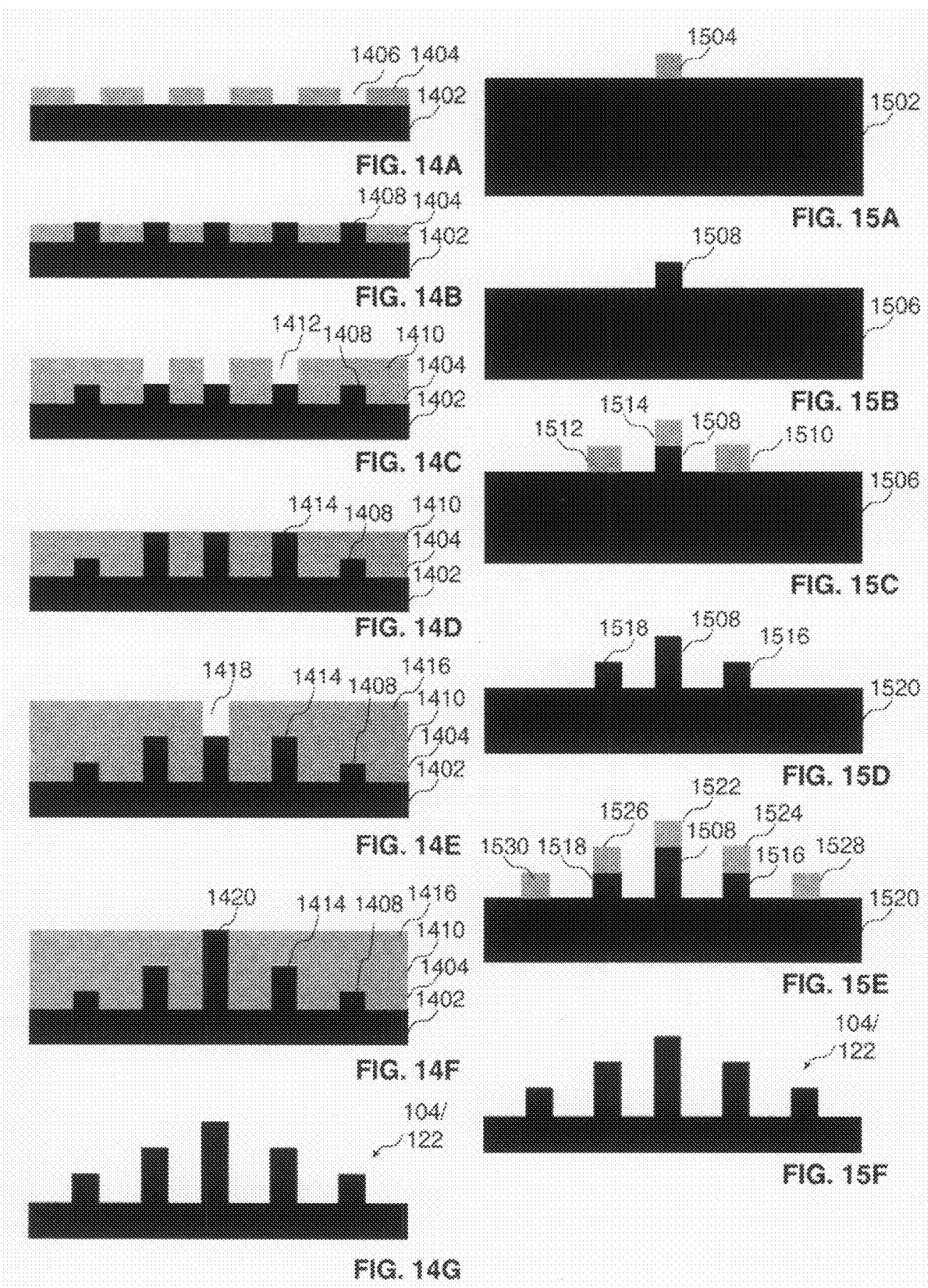

CONTACT PAD AND METHOD OF FORMING A CONTACT PAD FOR AN INTEGRATED CIRCUIT

FIELD OF THE INVENTION

The present invention relates generally to integrated circuits, and in particular, to a contact pad and a method of forming a contact pad for an integrated circuit.

BACKGROUND OF THE INVENTION

As the demand for smaller electronic devices continues, the dimensions of components used in such devices must decrease. Integrated circuit packages found in electronic devices are no exception. One common way that manufacturers have decreased the size of integrated circuit packages is through the use of solder balls. In a flip chip design, for example, solder bumps on a die are used eliminate wire bonds from the die to a substrate of the integrated circuit package. That is, a solder ball, often called a solder bump when formed on a contact pad of the die, enables a connection between the contact pad of the die and a corresponding contact pad of the substrate, as is well known in the art. Similarly, solder balls of a Ball Grid Array (BGA) device eliminate the need for leads normally used to connect the integrated circuit package to another device, such as a printed circuit board. In either case, the array of solder bumps on a die of a flip chip device or solder balls on a BGA package increases the input/output (I/O) density of the device by enabling the positioning of I/O pads anywhere on the die or integrated circuit package. In addition to reducing size of the integrated circuit package, the elimination of wire bonds and leads from a conventional package also lowers inductance and resistance, and provides better noise performance.

However, as with any bonding technique, it is important to ensure that the solder bumps or solder balls provide a reliable connection. In manufacturing semiconductor components, it is important that the components are free of defects and remain reliable throughout their use. When defects are present in an integrated circuit package, the percentage of usable devices decreases, and the profitability of the manufacturer will be impacted. Further, when an electronic device has an integrated circuit package which has a defective connection of a solder ball, the integrated circuit may function improperly or fail, and may cause an electronic device having the integrated circuit to function improperly or even stop functioning. Accordingly, it is important that defects in integrated circuit packages are minimized whenever possible.

One common source of failures in integrated circuit packages is found where components are soldered to contact pads. Many components are soldered to contact pads using solder balls which are reflowed when the component is placed. For example, a flip chip is soldered to a substrate by reflowing a plurality of solder bumps on the flip chip, and a ball grid array (BGA) is soldered to a printed circuit board by reflowing a plurality of solder balls on the BGA, as is well known in the art. Failures in the solder connection may be caused by a variety of defects in materials, such as poor solder quality, inadequate solder amount or other factors. On common cause of failures when soldering a flip chip to a substrate in a BGA device, or soldering a BGA device to a printed circuit board, is a solder crack at a junction with the contact pad. The crack normally initiates and propagates at the interface between contact pad and the solder ball. A BGA package reduces real estate requirements of a printed circuit board, provides more circuitry per unit area and facilitates automation of substrate assemblies. Hence, the demand of BGA packages has increased dramatically over last several years. However, the thermo-mechanical reliability of these packages is a concern for the electronics industry. The board level reliability of a solder joint is one of the most critical issues for the successful application of a BGA. While it is well know that increasing a solder ball pad opening size may improve the solder joint reliability, the pad opening size must be within a certain size which may not be increased for high density package design.

Accordingly, there is a need for an improved contact pad and method of forming a contact pad for an integrated circuit.

SUMMARY OF THE INVENTION

A contact pad of an integrated circuit is disclosed. The contact pad comprises a flat portion comprising a base of the contact pad; a plurality of projections extending from and substantially perpendicular to the flat portion; and a solder ball attached to the projections and the flat portion. The plurality of projections may comprise pillars having different heights. Further, the contact pad may comprise a contact pad on a die, a contact pad on a substrate of the integrated circuit, or both.

A contact pad of an integrated circuit according to an alternate embodiment comprises a flat portion comprising a base of the contact pad; a plurality of projections formed on and extending from the flat portion, the plurality of projections having a range of heights comprising short projections near outer ends of the contact pad extending toward a tall projection near a center of the contact pad; and a solder ball attached to the projections and the flat portion. The projections may comprise straight projections or tapered projections.

A method of forming a contact pad for an integrated circuit is also disclosed. The method comprises forming a flat portion having a base of the contact pad; forming a plurality of projections extending from and substantially perpendicular to the flat portion; and attaching a solder ball to the plurality of projections and the flat portion. The plurality of projections may be formed by forming at least one metal layer or by etching at least one metal layer. The projections may comprise short projections near ends of contact pad and a tall projection near the center of the contact pad. The contact pads may be formed on a die of an integrated circuit package or on a substrate of an integrated circuit package.

BRIEF DESCRIPTION OF THE DRAWINGS

FIG. 1 is a cross-sectional view of an integrated circuit package having contact pads according to an embodiment the present invention;

FIG. 2 is a cross-sectional view of a conventional contact pad showing a crack formed in the bond between the contact and the solder ball;

FIG. 3 is a cross-sectional view of a contact pad having a plurality of projections taken in the "x" direction according to an embodiment of the present invention;

FIG. 4 is a cross-sectional view of the contact pad of FIG. 3 taken at line A-A in the "y" direction according to an embodiment of the present invention;

FIG. 5 is a cross-sectional view of the contact pad of FIG. 3 taken at line A-A in the "y" according to an alternate embodiment of the present invention;

FIG. 6 is a cross-sectional view of the contact pad of FIG. 3 taken at line B-B in the "y" according to an embodiment the present invention;

FIG. 7 is a cross-sectional view of the contact pad of FIG. 3 taken at line C-C in the "y" according to an embodiment of the present invention;

FIG. 8 is a cross-sectional view of a contact pad having projections taken in the "x" direction according to an alternate embodiment of the present invention;

FIG. 9 is a cross-sectional view of the contact pad of FIG. 8 taken at line A-A in the "y" according to an embodiment of the present invention;

FIG. 10 is a cross-sectional view of the contact pad of FIG. 8 taken at line B-B in the "y" according to an embodiment of the present invention;

FIG. 11 is a cross-sectional view of the contact pad of FIG. 8 taken at line C-C in the "y" according to an embodiment the present invention;

FIG. 12 is a cross-sectional view of a contact pad having projections taken in the "x" direction according to another embodiment of the present invention;

FIG. 13 is a cross-sectional view of a contact pad having projections taken in the "x" direction according to a further embodiment the present invention;

FIG. 14 is a sequence of figures showing the formation of a contact pad having projections according to an embodiment of the present invention;

FIG. 15 is a sequence of figures showing the formation of a contact pad having projections according to an alternate embodiment of the present invention.

DETAILED DESCRIPTION OF THE DRAWINGS

Figure 16A:
FIG. 16 is a sequence of figures showing the formation of an integrated circuit having a contact pad according to an embodiment the present invention.

Turning first to FIG. 1, a cross-sectional view of an integrated circuit package having contact pads according to an embodiment the present invention is shown. In particular, the integrated circuit package of FIG. 1 comprises a die 102 having a plurality of contact pads 104 enabling connections to contact pads 106 of the substrate 107 by way of corresponding solder bumps 108. An underfill 110 may also be applied under the die 102. A lid 112 is then attached to the substrate by way of a bonding agent 114 between the die and the lid, and a bonding agent 116 between a side wall 118 of the lid and the substrate. Contact pads 122 on the substrate are also provided to make an electrical connection by way of solder balls 124 between the substrate and another device. For example, the solder balls may make a connection to contact pads 126 of a printed circuit board 128. Also, a partial section designated "A" shows a region of the cross section having a solder bump 108 between a contact pad 104 of the die 102 and a contact pad 106 of the substrate. A partial section "B" shows a region of the cross section having a solder ball 124 between a contact pad 122 of the substrate 107 and a contact pad on the device receiving the integrated circuit, such as a contact pad 126 on the printed circuit board 128. The partial sections "A" and "B" will be described in more detail in reference to enlarged views of these partial sections in FIGS. 2-13. That is, the contact pad having projections which will be described below may be used on the contact pad 104 of the substrate in partial section "A," or on the contact 122 of the substrate in partial section "B," or both.

As shown in the partial cross section of FIG. 2, a crack may form between the contact pad 202 and the solder ball 204 when a conventional contact pad is used. That is, when a crack begins to form on an end, the crack may continue to propagate until a fission between the solder ball and the contact pad is formed. FIGS. 3-13 will show embodiments of the present invention which will prevent or postpone the propagation of a crack in a bond between the solder ball and the contact pad.

Turning now to FIG. 3, a cross-sectional view of a contact pad having a plurality of projections according to an embodiment of the present invention is shown. While solder balls on contact pads of a die may also be referred to as solder bumps, reference will be made to solder balls for both contact pads on the die and contact pads on the substrate. As shown in FIG. 3, five projections comprising pillars or walls extend from the base 302 of the contact pad in a substantially perpendicular direction. In particular, a tall projection 304 having a height $h_1$ extends from the base, while intermediate projections 306 and 308 having a height $h_2$ extend from the base on either side with small projections 310 and 312 having a height $h_3$ on the ends. Although five projections having three heights are shown, a different number of projections and/or projections having different heights may also be employed according to the present invention. By way of example, for a contact pad having a width $w_1$ of 100 micrometers, the width $w_2$ of the projection may be approximately 10 micrometers. The height $h_1$ may be approximately 20 micrometers, the height $h_2$ may be approximately 15 micrometers, and the height $h_3$ may be approximately 10 micrometers.

As can be seen in FIG. 3, the use of the projections provides a barrier which prevents the transmission of a crack along the bond between the solder ball and the contact pad. That is, using several tapered projections, such as copper projections, instead of a flat contact pad increases the total contact area between contact pad and solder ball, and reduces the stress concentration level to prevent a crack from initiating or propagating. Projections with different heights may postpone the crack propagation by increasing the crack travel distance. A tall projection in the middle of the contact pad may be beneficial in preventing or postponing the crack propagation. Accordingly, the contact pad structure improves the solder ball reliability. Further, the overall contact area between contact pad and solder ball is increased, having the same effect as increasing the pad opening size. When a package is under a temperature cycle range, the stress concentration level will be decreased with this increased contact area. While the contact pad and the projections may comprise Copper, some other conductive alloy, such as an alloy comprising Nickel (Ni), a high Lead (Pb) solder, Titanium (Ti), or Aluminum (Al), may be used for the projections. This pad structure may be used for any other contact pad or structure in the integrated circuit package which may have fatigue failure caused by shear stress at the interface of either two structures or two different materials.

Turning now to FIGS. 4-7, cross-sectional views of the contact pad of FIG. 3 are shown. The cross-sectional view of the projection taken in the "y" direction at line A-A shows a straight projection having a uniform height across a length "l" of the projection. The length of the projection may be equal to the length of the contact pad, or shorter than the contact pad as shown. In contrast, the cross-sectional view of the projection in FIG. 5 shows that the individual projection 304 is also tapered. In particular, the projection comprises a first plateau P1, a second plateau P2 on either side of the first plateau, and a third plateau P3 on the ends of the projection. The number of plateaus may vary depending upon the number of projections having different heights. As will be described in more detail in reference to FIGS. 14 and 15, the number of metallization steps or etching steps to form projections having different heights may also determine the number of plateaus in a given projection. The shapes of the various projections may be tapered in the "y" direction such that the overall shape of the projections of the contact pad will form a pyramid structure. For example, referring to FIGS. 6 and 7, the cross-sectional view of the contact pad of FIG. 3 taken at line B-B shows a first plateau P1 and a second plateau P2 of the projections 306 and 308. Similarly, the projections 310 and 312 comprise a single plateau P1 as shown in the cross-sectional view of the contact pad of FIG. 3 taken at line C-C.

Turning now to FIG. 8, a cross-sectional view of a contact pad having projections according to an alternate embodiment of the present invention is shown. In contrast to the embodiment of FIG. 3, the projections of the embodiment of FIG. 8 extend from the longest projection on the outer edges of the contact pad to the shortest projection in the middle. In particular, a short projection 804 is positioned between two intermediate projections 806 and 808, and two tall projections 810 and 812 on the ends. Referring to FIG. 9, as shown in the cross-sectional view of the contact pad of FIG. 8 taken at line A-A, the projections may be tapered in the "y" direction in the same manner that the projections are tapered in the "x" direction. In particular, the projection 804 comprises a first plateau P1 in the center, a second plateau P2 on either end of the first plateau, and a third plateau P3 on the ends. Similarly, as shown in FIG. 10, a cross-sectional view of the contact pad taken at line B-B of FIG. 8 shows a center plateau P1 between portions of a plateau P2. Finally, the cross-sectional view of the contact pad of FIG. 8 taken at line C-C shows that the projections on the end have a uniform length. Accordingly, the projections are tapered in both the "x" and "y" directions to form a tapered contact which will more closely follow the shape of the solder ball.

Turning now to FIG. 12, a cross-sectional view of a contact pad having projections according to another embodiment of the present invention is shown. In particular, a base 1202 of the contact pad comprises a plurality of projections 1204-1214, each having a uniform height. According to a cross-sectional view of a contact pad having projections of FIG. 13, a base 1302 comprises a plurality of projections 1304-1312 having alternating heights. Short projections 1304-1308 extending from the base 1302 are separated by two intermediate projections 1310 and 1312. The arrangement of alternating projections may also be reversed, where the taller projections are on the ends of the contact pad. While five projections are shown in each of the embodiments, other numbers of projections may be employed.

Turning now to FIG. 14, a sequence of figures shows the formation of a contact pad having projections according to an embodiment of the present invention. In particular, after a first metal layer 1402 and a mask layer 1404 having a plurality of openings 1406 are formed as shown in FIG. 14A, a first level 1408 of the projections is formed as shown in FIG. 14B. A second mask layer 1410 is then applied, and additional openings 1412 are formed as shown in FIG. 14C. A second layer 1414 of the inner three projections is then formed as shown in FIG. 14D. Finally, a third mask layer 1416 having an opening 1418 is then formed as shown in FIG. 14E, where the additional layer 1420 of the middle projection is formed as shown in FIG. 14 F. The resulting contact pad structure of contact pads 104 or 122 is then shown in FIG. 14G after the mask layers are removed.

Turning now to FIG. 15, a sequence of figures shows the formation of a contact pad having projections according to an alternate embodiment of the present invention. In particular, after a thick metal layer 1502 of the contact pad is formed, a first mask layer having a mask region 1504 is formed to preserve the top layer of the middle projection as shown in FIG. 15A. After an etching step, a metal layer 1506 having a reduced thickness and a top portion 1508 of the middle projection is created as shown in FIG. 15B. A second mask layer having mask regions 1510 and 1512 for projections adjacent to the middle projection and a mask region 1514 on the top portion 1508 of the middle projection is formed as shown in FIG. 15C. After an etching step, the middle projection 1508 and adjacent projections 1516 and 1518 are formed as shown in FIG. 15D. A third mask layer is then formed as shown in FIG. 15E. In particular, a first mask portion 1522 is formed over the middle projection, while mask portions 1524 and 1526 are formed over the top portions 1516 and 1518 of the two adjacent projections and mask portions 1528 and 1530 are formed over the area which will have the outer projections. The resulting contact pad structure for contact pads 104 and 122 after the final etching step is then shown in FIG. 15F.

Figure 16B:
Figure 16C:
Figure 16D:
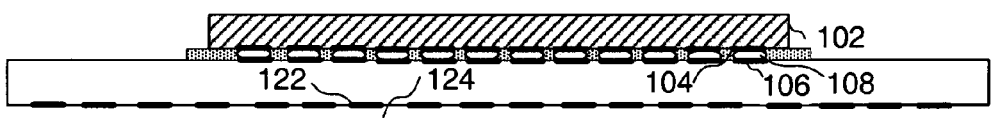
Figure 16E:
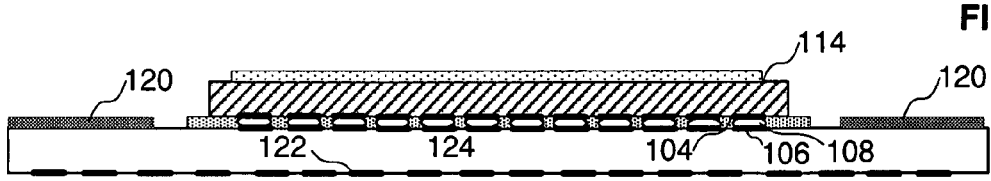
Figure 16F:
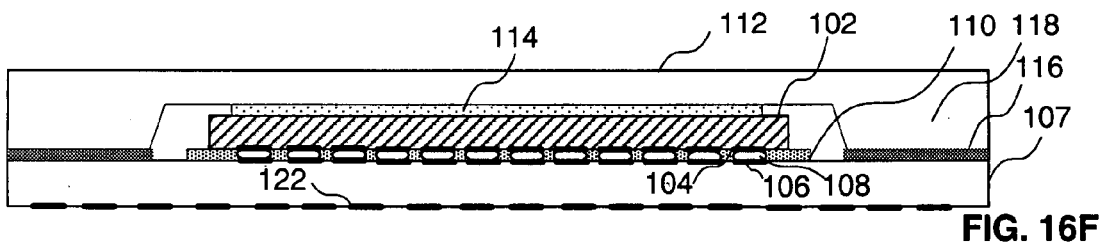
Figure 16G:
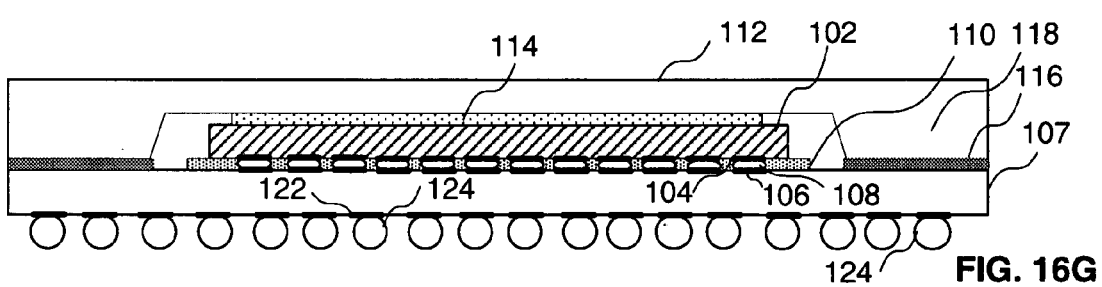
Figure 16H:
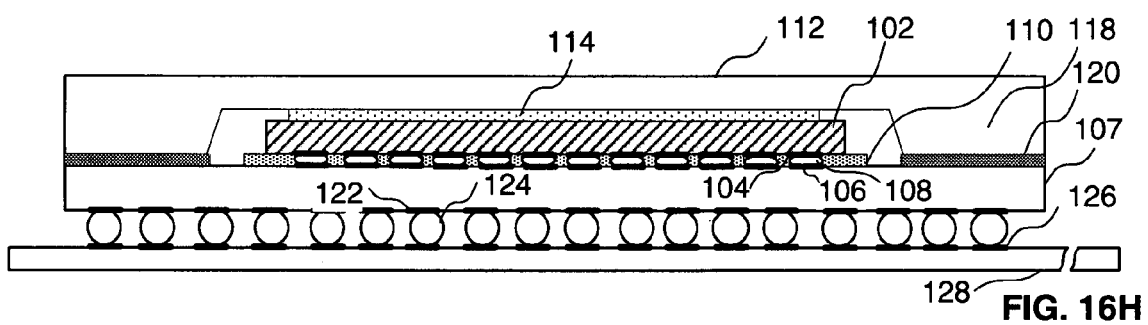

Turning now to FIG. 16, a sequence of figures shows the formation of an integrated circuit having a contact pad according to an embodiment the present invention. In particular, the contact pads described in FIGS. 3-13 are formed on a die as shown in FIG. 16A. The contact pads may be formed on the die as described above in reference to FIGS. 14 and 15, or by some other suitable technique. The solder balls 108 are then attached as shown in FIG. 16B. The contact pads 106 and 122 are also formed on the substrate as shown in FIG. 16C, where the contact pads 122 having projections may also be formed on the substrate as described above in reference to FIGS. 14 and 15, or by some other suitable technique. The die is then attached to the substrate as shown in FIG. 16D by reflowing the solder balls 108, as is well know in the art. A bonding agent such as an adhesive material may then be applied to attach a lid to the substrate as shown in FIG. 16E. In particular, a first adhesive 114 may be applied to the die and a second adhesive 116 may be applied to the portion of the substrate adapted to receive the side walls of the lid. Adhesive 114 and 120 may be the same adhesive material, or a different adhesive material. After the lid is attached as shown in FIG. 16F, the solder balls 124 are attached as shown in FIG. 16G to form a complete integrated circuit device. Finally, the integrated circuit may then be attached to the printed circuit board as shown in FIG. 16H by reflowing the solder balls 124.

It can therefore be appreciated that the new and novel contact pad and method of forming a contact pad for an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A contact pad of an integrated circuit, the contact pad comprising:
   a flat portion comprising a base of the contact pad;
   a plurality of projections extending in a first direction, each projection of the plurality of projections having a different height at a highest point, wherein each projection of the plurality of projections has a plurality of plateaus having different heights, and wherein the plurality of plateaus of a projection of the plurality of projections extends in an approximately straight line in a second direction that is perpendicular to the first direction; and
   a solder ball attached to the plurality of projections and the flat portion.

2. The contact pad of claim 1 wherein the plurality of projections comprises a plurality of projections having a range of heights comprising short projections at outer ends of the contact pad extending toward a taller projection near a center of the contact pad.

3. The contact pad of claim 1 wherein the plurality of projections comprises a plurality of projections having a range of heights comprising tall projections at outer ends of the contact pad extending toward a short projection near a center of the contact pad.

4. The contact pad of claim 1 wherein the plurality of projections comprises projections having alternating heights.

5. The contact pad of claim 1 wherein the contact pad comprises a contact pad on a die.

6. The contact pad of claim 1 wherein the contact pad comprises a contact pad on a substrate.

7. A contact pad of an integrated circuit, the contact pad comprising:
   a flat portion comprising a base of the contact pad;
   a plurality of projections formed on and extending from the flat portion, the plurality of projections extending in a first direction and having a range of heights at a highest point, wherein the highest points of the plurality of projections are tapered in the first direction and wherein each projection is tapered in a second direction that is perpendicular to the first direction; and
   a solder ball attached to the projections and the flat portion.

8. The contact pad of claim 7 wherein the plurality of projections comprises projections formed by a series of metallization steps.

9. The contact pad of claim 7 further comprising a plurality of contact pads each having the flat portion and the plurality of projections, wherein a contact pad of the plurality of contact pads is formed on a die.

10. The contact pad of claim 9 wherein a contact pad of the plurality of contact pads is formed on a substrate.

11. The contact pad of claim 7 wherein the contact pad comprises a contact pad on a substrate.

12. A method of forming a contact pad for an integrated circuit, the method comprising:
    forming a flat portion comprising a base of the contact pad;
    forming a plurality of projections extending in a first direction, each projection of the plurality of projections having a different height at a highest point, wherein each projection of the plurality of projections has a plurality of plateaus having different heights, and wherein the plurality of plateaus of a projection of the plurality of projections extends in an approximately straight line in a second direction that is perpendicular to the first direction; and
    attaching a solder ball to the plurality of projections and the flat portion.

13. The method of claim 12 wherein forming a plurality of projections comprises forming at least one metal layer.

14. The method of claim 12 wherein forming a plurality of projections comprises etching at least one metal layer.

15. The method of claim 12 wherein forming a plurality of projections comprises forming projections extending from short projections nears outer ends of the contact pad to a tall projection near a center of the contact pad.

16. The method of claim 12 wherein forming a plurality of projections comprises forming projections extending from tall projections nears outer ends of the contact pad to a short projection near a center of the contact pad.

17. The method of claim 12 wherein forming a flat portion comprising a base of the contact pad comprises forming a contact pad on a die or on a substrate of an integrated circuit package.

\* \* \* \* \*